(12) United States Patent
Eccles et al.

(10) Patent No.: US 7,124,382 B1
(45) Date of Patent: Oct. 17, 2006

(54) METHOD AND APPARATUS FOR RULE FILE GENERATION

(75) Inventors: Robert E. Eccles, San Jose, CA (US); Mark Brian Roberts, Auburn, CA (US)

(73) Assignee: Xilinx, Inc., San Jose, CA (US)

( * ) Notice: Subject to any disclaimer, the term of this patent is extended or adjusted under 35 U.S.C. 154(b) by 743 days.

(21) Appl. No.: 10/090,256

(22) Filed: Mar. 1, 2002

(51) Int. Cl.
*G06F 17/50* (2006.01)

(52) U.S. Cl. .............................. 716/5; 716/4

(58) Field of Classification Search .............. 716/1–12
See application file for complete search history.

(56) References Cited

U.S. PATENT DOCUMENTS

| | | | |
|---|---|---|---|
| 5,361,373 A | 11/1994 | Gilson | |
| 5,537,601 A | 7/1996 | Kimura et al. | |
| 5,652,904 A | 7/1997 | Trimberger | |
| 5,671,355 A | 9/1997 | Collins | |
| 5,752,035 A | 5/1998 | Trimberger | |
| 5,970,254 A | 10/1999 | Cooke et al. | |
| 6,020,755 A | 2/2000 | Andrews et al. | |
| 6,096,091 A | 8/2000 | Hartmann | |
| 6,275,971 B1 * | 8/2001 | Levy et al. | 716/5 |
| 6,279,045 B1 | 8/2001 | Muthujumaraswathy et al. | |
| 6,282,627 B1 | 8/2001 | Wong et al. | |
| 6,298,319 B1 * | 10/2001 | Heile et al. | 703/26 |
| 6,343,207 B1 | 1/2002 | Hessel et al. | |
| 6,374,395 B1 * | 4/2002 | Wang | 716/11 |
| 6,418,551 B1 * | 7/2002 | McKay et al. | 716/5 |
| 6,606,735 B1 * | 8/2003 | Richardson et al. | 716/5 |
| 6,826,735 B1 * | 11/2004 | Ono et al. | 716/4 |
| 2003/0061583 A1 * | 3/2003 | Malhotra | 716/5 |

OTHER PUBLICATIONS

Cary D. Snyder and Max Baron; "Xilinx's A-to-Z System Platform"; Cahners Microprocessor; The Insider's Guide to Microprocessor Hardware; Microdesign Resources; Feb. 6, 2001; pp. 1–5.

* cited by examiner

*Primary Examiner*—Thuan Do
*Assistant Examiner*—Binh Tat
(74) *Attorney, Agent, or Firm*—H. C. Chan; Robert Brush (57) ABSTRACT

Method and apparatus are described for providing a rule file. More particularly, a design rule document is converted to a table file of design rules and associated design rule values, where design rules follow a naming convention to maintain uniqueness among them. A parameterized design rule check (PDRC) file is obtained. Such a PDRC file calls out design rule names instead of design rule values. A computer program is used to exchange design rule values associated with design rule names in the table file for the design rule names called out in the PDRC file to provide a design rule check (DRC) file. This method and apparatus also apply to any technology file containing parameterized rules.

22 Claims, 12 Drawing Sheets

Physical Layout Rules    Release    2.4

1. Metal Rules

| Rule | Description | Drawn | Sized | Final |
|---|---|---|---|---|
| GR100 | M1 width | 1.0 | 1.2 | 0.6 |
| GR104_x | M1 space when m1 width <= GR104_w | 2.0 | 2.2 | 1.1 |
| GR104 | M1 space when m1 width > GR104_w | 4.0 | 4.2 | 2.1 |

2. Parameters

| Rule | Description | Drawn | Sized | Final |
|---|---|---|---|---|
| GR104_w | M1 width parameter | 5.0 | 5.2 | 2.6 |
| GRfilename | Name of DRC file | drc_patent.rules | drc_patent.rules | drc_patent.rules |
| GRdrcversion | Current version of the pdrc file | 1.1 | 1.1 | 1.1 |
| GRrevision | Current version of the rules file | 2.4 | 2.4 | 2.4 |

```
;;==============================================================================
;;
;;  © Copyright Xilinx, Inc. 2001-2002. All rights reserved.
;;
;;==============================================================================
;;
;; File     : rule_filename (derived from: drc_patent.pdrc)
;; Version  : DRC file: rule_drcversion  Spreadsheet: rule_revision
;; Purpose  : This file contains the Assura design rules for the test process.
;;            Before parameter substitution, all parameters have the prefix
;;            "rule_" in front of the rule name.
;;
;; Revision :
;; 2002-02-20 MBR 1.1 Created.
;;============================================================================== drcExtractRules( fprintf( stderr "\n")
fprintf( stderr " Rules File   : Version rule_drcversion\n" )
fprintf( stderr " Design Rules : Version rule_revision\n" )
fprintf( stderr "\n")

layerDefs( "DF2"
    m1 = layer( "m1" type( "drawing" ))
)
layerDefs( "GDS2"
    m1 = layer( (6 type( 0 )))
)
```

800

| FIG. 8A | FIG. 8B |

; Derived Layers

; Find metal whose width is greater than rule_104_w
m1_104 = geomSize( m1 -rule_104_w/2.0 downUp )

; Find metal whose width is less than or equal to rule_104_w
m1_104_x = geomAndNot( m1 m1_104 )

; Metal Rules drc( m1 width < rule_100
  "{100} M1 width < rule_100"
)
drc( m1_104_x sepNotch < rule_104_x
  "{104_x} M1 space < rule_104_x (if line width <= rule_104_w)"
)
drc( m1_104 sepNotch < rule_104
  "{104} M1 space < rule_104 (if line width > rule_104_w)"
)

) ; End of drcExtractRules

© Copyright Xilinx, Inc. 2001-2002. All rights reserved.

FIG. 8B

```
;;=====================================================
;
; © Copyright Xilinx, Inc. 2001-2002.  All rights reserved.
;
;=====================================================
;
; File    : drc_patent.rules (derived from: drc_patent.pdrc)
; Version : DRC file: 1.1 Spreadsheet: 2.4
; Purpose : This file contains the Assura design rules for the test process.
;           Before parameter substitution, all parameters have the prefix
;           "rule_" in front of the rule name.
;
;=====================================================
; Revision :
; 2002-02-20 MBR 1.1 Created.
;===================================================== drcExtractRules( fprintf( stderr "\n" )
fprintf( stderr " Rules File    : Version 1.1\n" )
fprintf( stderr " Design Rules : Version 2.4\n" )
fprintf( stderr "\n" )

layerDefs("DF2"
    m1 = layer( "m1" type( "drawing" ))
)
layerDefs("GDS2"
    m1 = layer( (6 type( 0 )))
)
```

900

| FIG. 9A | FIG. 9B |

METHOD AND APPARATUS FOR RULE FILE GENERATION

FIELD OF THE INVENTION

The present invention relates generally to rule file generation, and more particularly to use of a parameterized rule file.

BACKGROUND OF THE INVENTION

The process for producing an integrated circuit comprises many steps. Conventionally, a logic design is followed by a circuit design, which is followed by a layout design. With respect to the circuit design and layout portion, once circuits for an integrated circuit have been designed, such designs are converted to a physical representation known as a "circuit layout" or "layout." Conventionally, a layout may be viewed as an elevational view representing semiconductor process layers forming physical devices, such as transistors, contacts, and buses, among other well-known circuit elements. Layout is exceptionally important to developing a working design as it affects many aspects, including, but not limited to, signal noise, signal time delay, resistance, cell area, and parasitic effect.

Once an initial layout is done, it must be checked to ensure spacing between circuit elements conforms to a set of rules known as Design Rules. Design Rules conventionally set minimum spacings, sizes and the like for circuit elements. Though a layout is developed with such Design Rules in mind, there may be violations of such Design Rules owing to complexity or magnitude of the circuitry to be laid out or of the Design Rules themselves.

Accordingly, a next step in the design process is to perform a Design Rule Check, more commonly known as a DRC, on a layout. This step is important because violation of one or more Design Rules may result in a higher probability, and in some cases an absolute certainty, that a fabricated chip would not work as desired.

Conventionally, a circuit designer designs a circuit on a computer using a computer-aided design (CAD) tool. Data from such a CAD designed circuit is provided to a computer-aided engineering (CAE) tool. This CAE tool is used to produce a layout. However, a layout so produced may still have one or more Design Rule violations. Accordingly, what is known as "Physical Verification and Analysis" is done. Components of this include a DRC and a Layout Versus Schematic (LVS) check. DRC and LVS are conventionally done with a Design Rule Checker and an LVS Verifier, both of which are CAE tools.

A Design Rule Checker may access specified Rules File and Rules Library for purposes of checking a proposed layout. Unfortunately, Rules Files, or DRC files, conventionally are written with numbers associated with logical operators embedded in such files. Moreover, it is not uncommon for a same number to be used multiple times throughout a file. However, though a number may appear in multiple places does not necessarily mean it refers to the same rule. This makes update DRC file numbers time consuming and prone to error.

Accordingly, it would be desirable to provide DRC file updating solution that is less time intensive and error prone.

Furthermore, there are additional EDA tools which use "technology files" that contain design rule information. These technology files are used to control and configure EDA tools. Some examples of EDA tools which require technology files containing design rule data are extraction, compaction, and parameterized cells layout.

SUMMARY OF THE INVENTION

An aspect of the present invention is replacement of a number value with a reference to a parameter name. A numeric value of each parameter may then be specified in a single location. A rule file may then be generated by combining a parameter value file with a parameterized rule file. A method in accordance with one or more aspects of the present invention may be used to create a rule file with updated numbers or to generate several numerical variations of the same rule file.

An aspect of the present invention is a method for generating a rule file. More particularly, a rule document is obtained. A table file is generated from the rule document. A parameterized rule file is obtained. Values associated with rules in the table file are mapped to matching rules in the parameterized rule file. Another aspect of the present invention is a program product for generating one or more rule files.

Another aspect of the present invention is a data structure. More particularly, the data structure comprises a plurality of logical operations associated with respective rules names. Each of the rule names comprises a rule indicator.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
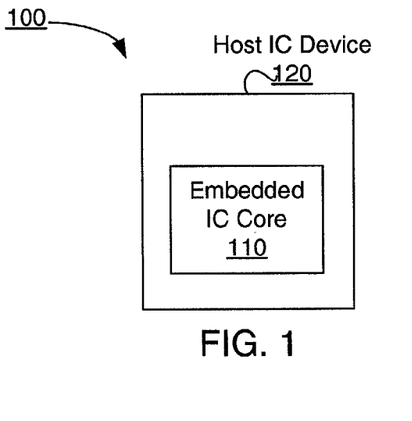
FIG. 1 is a block diagram of an exemplary embodiment of an integrated circuit in accordance with one or more aspects of the present invention.

FIG. 1 is a block diagram of an exemplary embodiment of an integrated circuit 100 of the prior art. Integrated circuit 100 comprises embedded device 110 and host device 120. Assuming that embedded device 110 was originally laid out for one lithography and that host device 120 was originally laid out for another lithography, sizing and scaling of layers may need to be done. So, for example, if embedded device 110 is formed using 0.13 micron lithography and host device 120 is formed using 0.18 micron lithography, layers would need to be sized and scaled accordingly.

Figure 2:
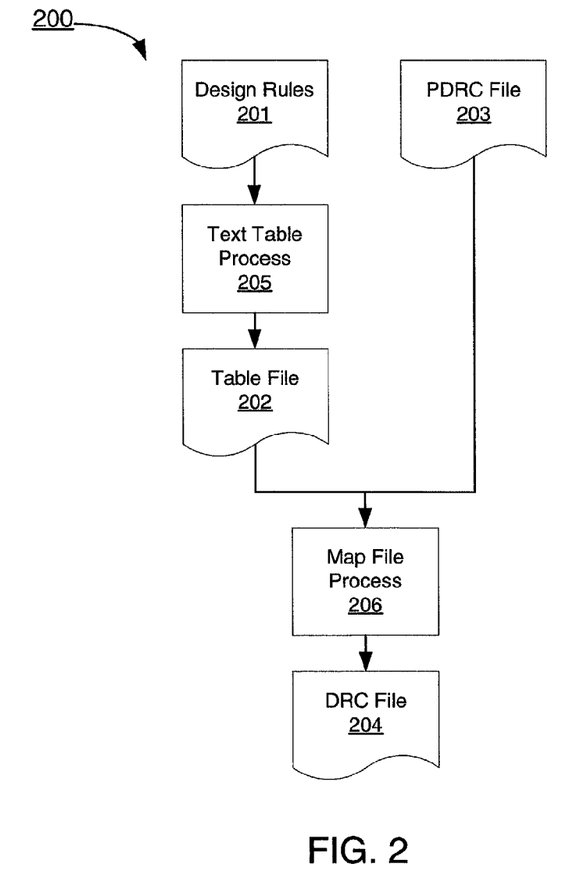
FIG. 2 is a flow diagram of an exemplary embodiment of a parameterized DRC file process for providing a DRC file in accordance with one or more aspects of the present invention.

FIG. 2 is a flow diagram of an exemplary embodiment of a parameterized DRC file process 200 for providing a DRC file 204 in accordance with one or more aspects of the present invention. At step 201, a design rule document is obtained. Design Rule document 201 comprises layout design rules. Such layout design rules are defined for at least a plurality of minimum spacings for well-known circuit elements. Design Rule document 201 may be in the form of a spreadsheet, database or other known document type for recording information in a relational manner. Design rules in Design Rule document 201 are associated with design rule names. Naming of design rules is in accordance with a design rule naming convention. Using an example of a Design Rule document 201 as a spreadsheet, a design rule name is associated with a corresponding design rule value. Notably, Design Rule document 201 may be created such that two or more different design rules have a same design rule value, but no two or more design rules have the same design rule name. Thus, each design rule name is unique within Design Rule document 201.

At step 205, a Text Table process is run. Text Table process 205, described in more detail below, is used to provide a Table file at step 202. Table file 202 defines parameter names derived from design rule names and parameter values derived from design rule values.

At step 203, a Parameterized DRC (PDRC) file is obtained. Notably, PDRC file 203 and Design Rule document 201 are obtained, as they are not automatically generated by process 200.

PDRC file 203 comprises logical operations used to check design rules defined in Design Rule document 201. PDRC file 203 is created such that each logical operation is associated with a parameter name. Each parameter name is unique. Notably, there can be more than one logical operation associated with a single layout design rule. There can be more than one parameter assigned to each design rule. Parameter names may be associated with a particular design rule, but not all logical operations are necessarily associated with a parameter and not all design rules necessarily need a parameter. For example, there may be a design rule A that states layer 1 cannot cover layer 2. Because there are no numbers associated with design rule A, there are no parameters either. In creation of a table file A, design rule A would be extracted to form part of such a table file A and have a null value as a parameter. However, because this parameter is not referenced in a PDRC file A, existence of design rule A in table file A does not affect creation of a DRC file A.

At step 206, a Map File process is run. Map file process 206, with access to PDRC file 203 and Table file 202, is used to replace parameter names in PDRC file 203 with parameter values in Table file 202 using parameter names for this association. Map File process 206 produces a DRC file at step 204. DRC file 204 comprises design rule parameter values and associated design rule logical operations.

Figure 3:
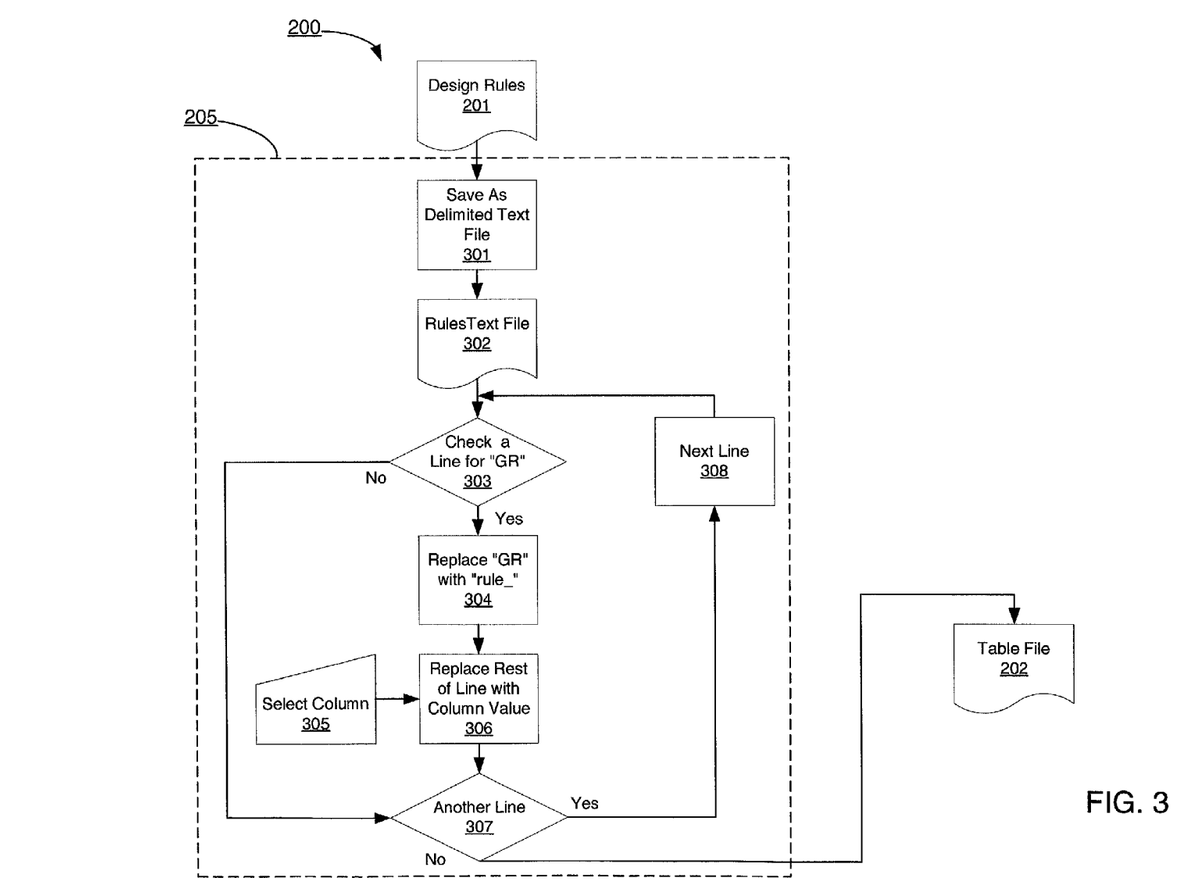
FIG. 3 is a flow chart of an exemplary embodiment of a parameterized DRC file process for providing a DRC file in accordance with one or more aspects of the present invention.
Figure 4:
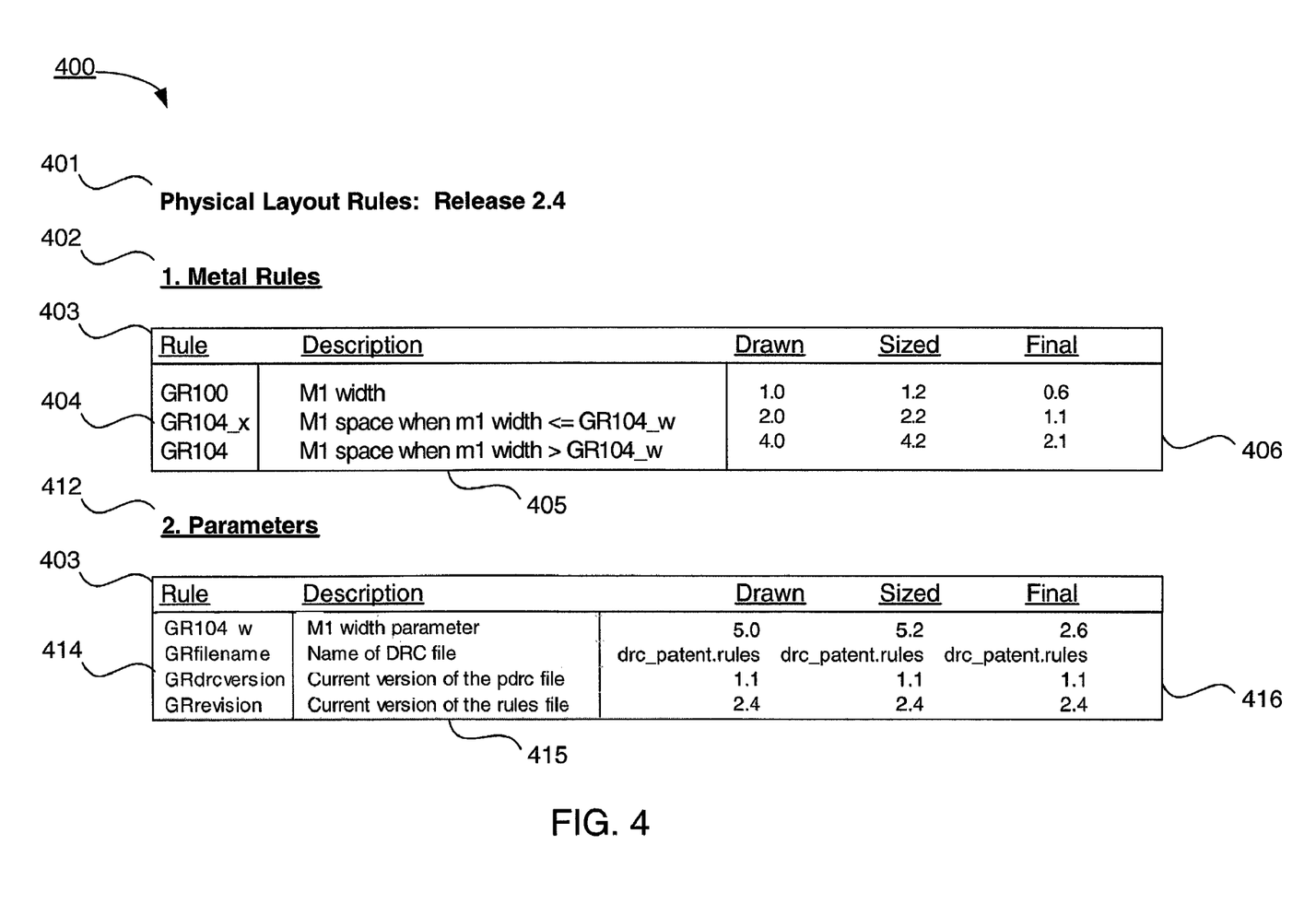
FIG. 4 is text of an exemplary embodiment of a Design Rule spreadsheet document of the prior art.

Referring to FIG. 3, there is shown a flow chart of a portion of parameterized DRC file process 200 comprising an exemplary embodiment of a Text Table process 205 in accordance with one or more aspects of the present invention. As input to Text Table process 205, a Design Rule document 201 is used. As mentioned above, Design Rule document 201 may be in a form of a spreadsheet. In order to more clearly describe a Design Rule document 201, an example of a Design Rule spreadsheet document 400 is shown in FIG. 4.

Design Rule spreadsheet document 400 comprises a file heading 401 and file subheadings 402 and 412. Under file subheadings 402 and 412 is table header 403 and respective groups of tabulated information for design rule names 404, 414, design rule descriptions 405, 415, and design rule values 406, 416. For example, each design rule name begins with "GR." Notably, not all design rule values need to be numerical. For example, under parameters, design rule GRfilename is a name of a DRC file called "drc_patent.rules."

Referring again to FIG. 3, at step 301, Design Rule document 201 is saved as a delimited text file by tab delimiting or semicolon delimiting, among other delimiters. Delimiting at step 301 produces Rules Text file 302. For example, referring to FIG. 5, there is shown an embodiment of a tab delimited Rule Text file 500 obtained from Design Rules document 400 of FIG. 4.

Referring again to FIG. 3, at a line of Rules Text file 302 is checked for a design rule name indicator. Continuing the example in FIG. 4, a "GR" may be used as a design rule name indicator, in which embodiment step 303 checks for a "GR." Step 303 may, but need not, start with a first line in Rules Text file 302. Notably, "GR" is merely an example and other design rule name indicators may be used.

If no design rule name indicator is found for a line at step 303, then a check for another line to check in Rules Text file is made at step 307. If a design rule name indicator is found for a line at step 303, then such a design rule name indicator is replaced with another design rule name indicator at step 304. For example, a replacement design rule indicator may be "rule_". Notably, step 304 may be omitted if a design rule indicator used in design rule document 201 is the same as a design rule indicator used in PDRC file 203.

At step 305, a user selects a column for a design rule associated with such a line having a substituted design rule name indicator. By selecting a column, a design rule value or a DRC file is selected. In the example of FIG. 4, values or a DRC file may be selected from Drawn, Sized and Final columns. At step 306, a line selected at step 303 is further processed by having contents, other than its newly assigned substitute design rule name indicator, replaced with a design rule value or DRC file name selected by a user at step 305.

A check for another line to check in Rules Text file is made at step 307. If there is another line to check in Rules Text file 302, then at step 308 a next line is obtained for checking at step 303. If at step 307 there are no more lines to check in Rules Text file 302, Table file 202 is produced.

Figure 5:
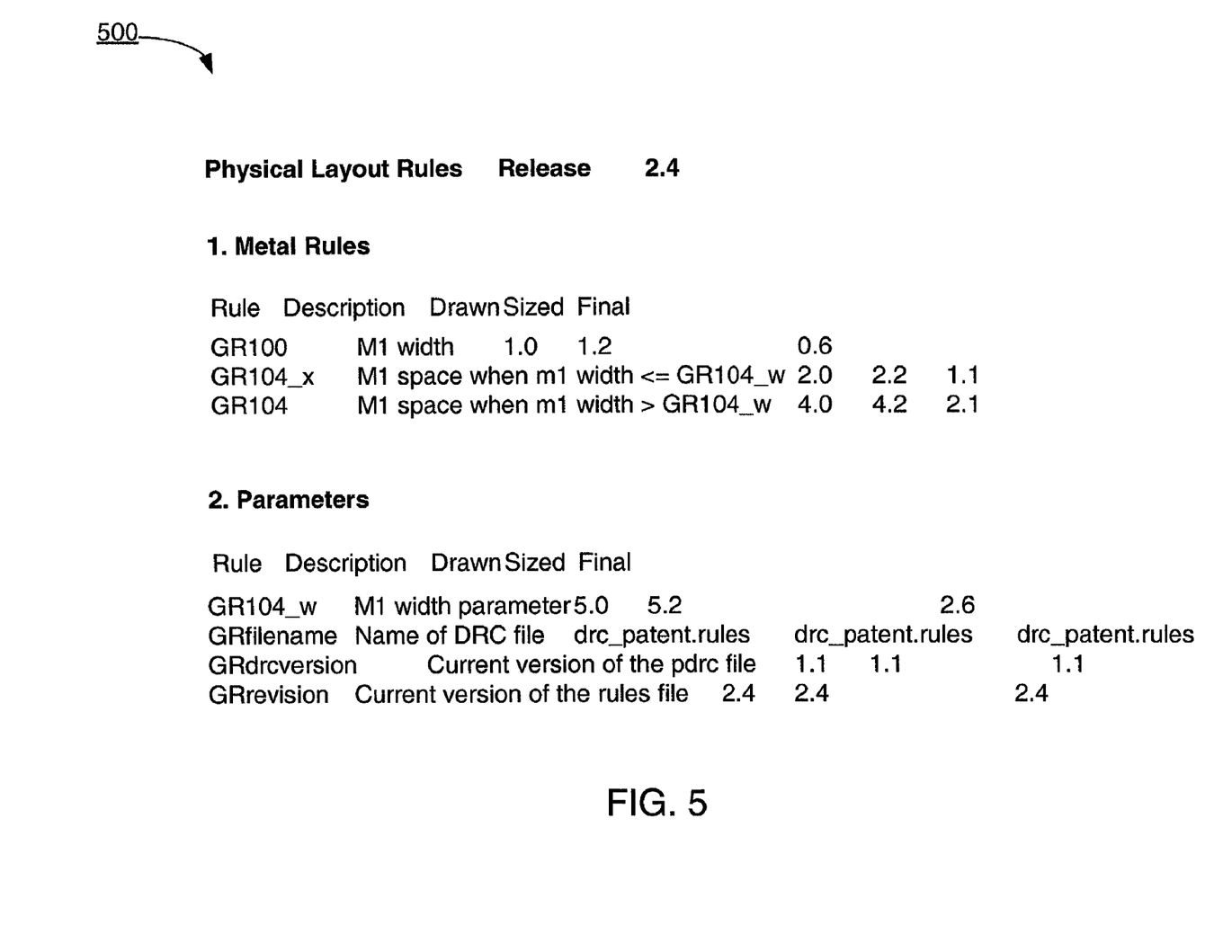
FIG. 5 is text of an exemplary embodiment of a tab delimited Rule Text file obtained from the Design Rules document of FIG. 4 in accordance with one or more aspects of the present invention.
Figure 6:
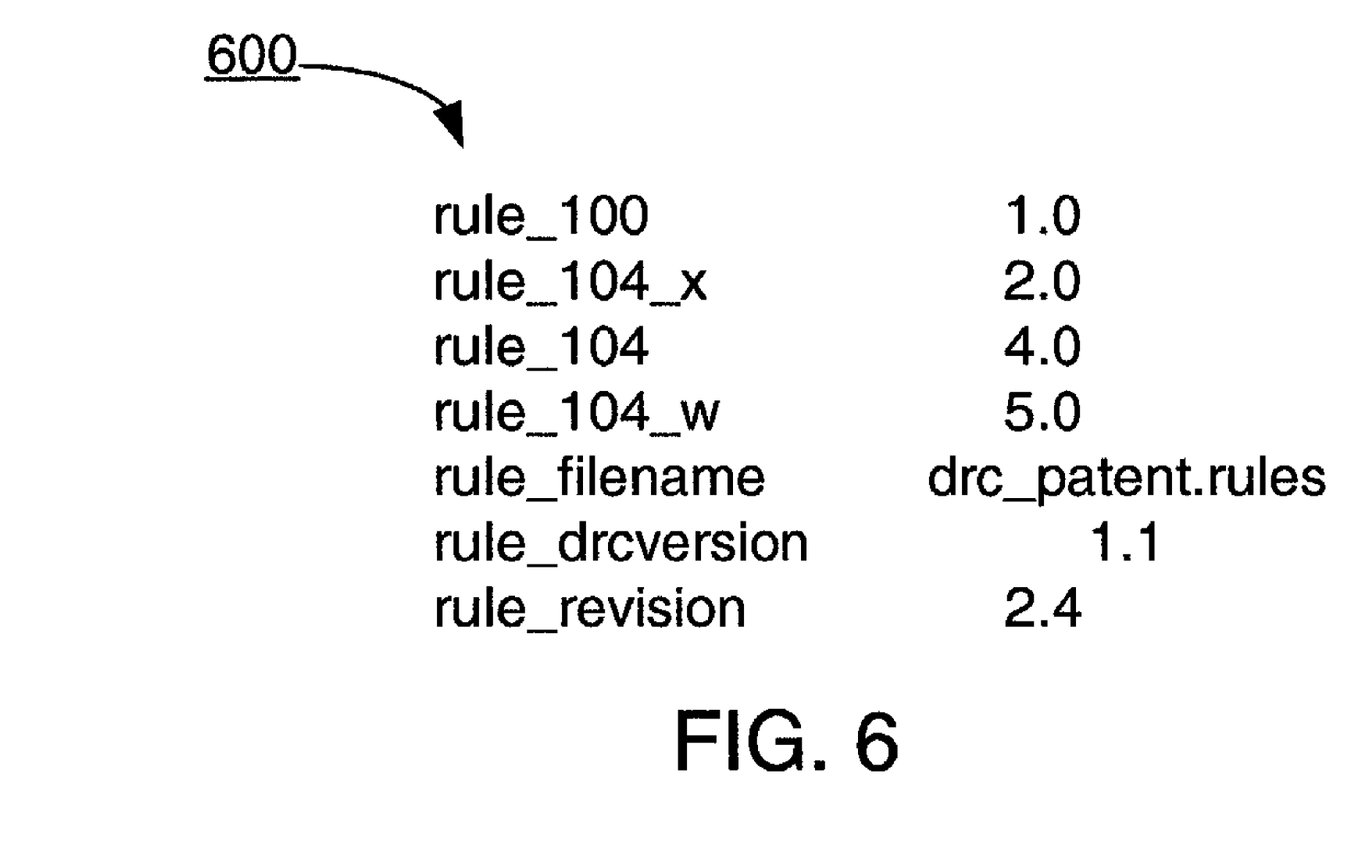
FIG. 6 is a text of an exemplary embodiment of a Table file that may have been produced from the Rules Text file of FIG. 5 in accordance with one or more aspects of the present invention.

Referring to FIG. 6, there is shown an exemplary embodiment of a Table file 600 that may have been produced from Rules Text file 500 of FIG. 5. Table file 600 would be produced by selecting the Drawn column each time at step 305 of FIG. 3. Notably, though FIG. 3 is described in terms of a user selecting a column, it should be understood that a user may be a programmed computer, as described below in more detail.

Figure 7:
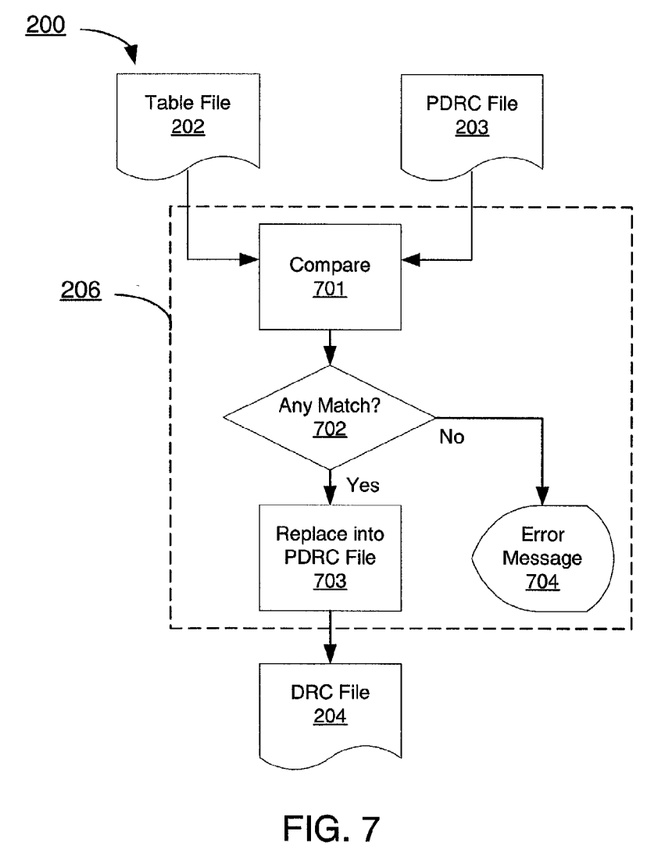
FIG. 7 is a flow chart of a portion of the parameterized DRC file process of FIG. 2 comprising an exemplary embodiment of a Map file process in accordance with one or more aspects of the present invention.

Referring to FIG. 7, there is shown a flow chart of a portion of parameterized DRC file process 200 comprising an exemplary embodiment of a Map file process 206 in accordance with one or more aspects of the present invention. Map file process 206 comprises inputs of Table file 202 and PDRC file 203.

Referring again to FIG. 7, at step 701 expressions in PDRC file 203 beginning with a design rule indicator equivalent to a substituted design rule indicator are compared against design rule names listed in Table file 202. Matching associations are recorded at step 702. An optional check may be made at step 702 to determine if there is at least one match with respect to design rules in Table file 202 and those called out in PDRC file 203. If there is no match, an optional error message may be displayed at step 704.

Figure 8A:
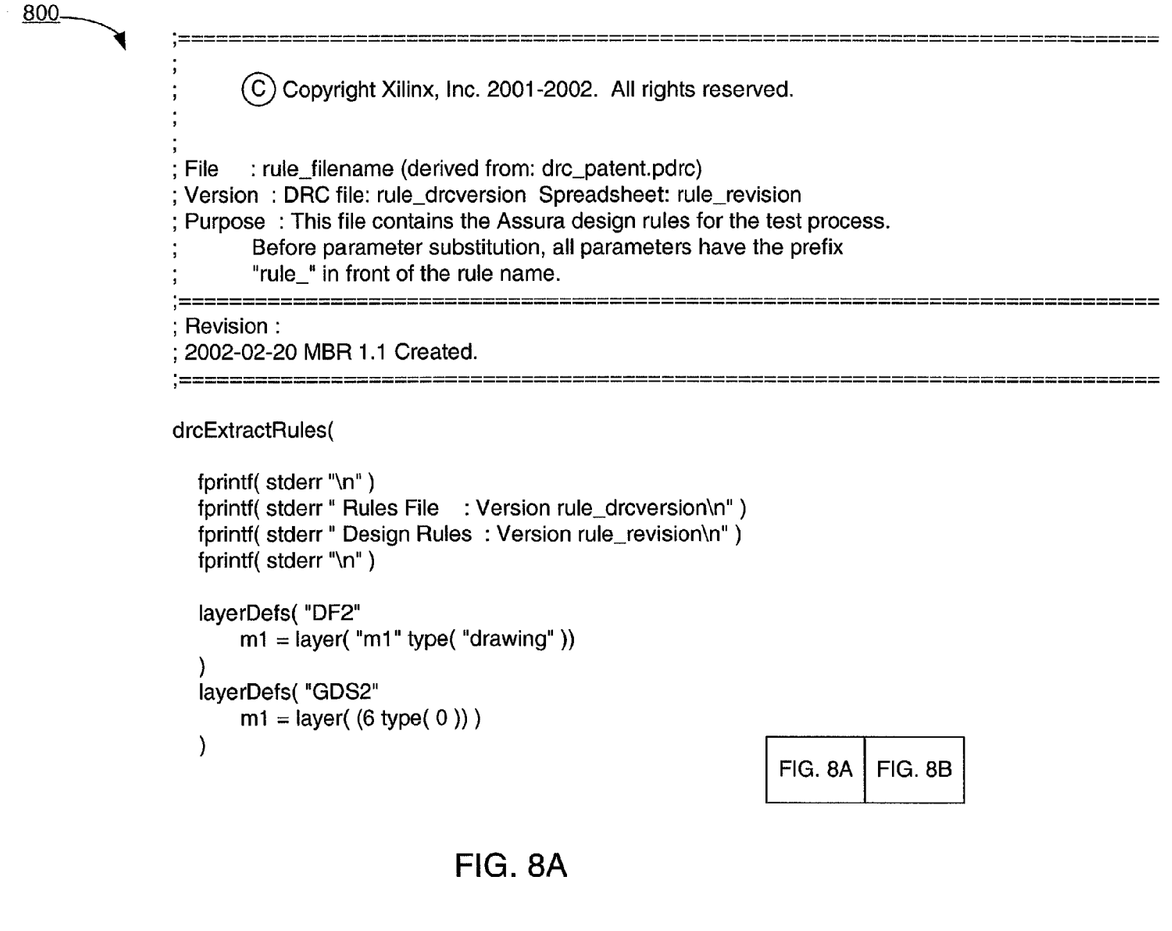
FIGS. 8A and 8B are text of an exemplary embodiment of a parameterized design rule check (PDRC) data structure in accordance with one or more aspects of the present invention.
Figure 8B:
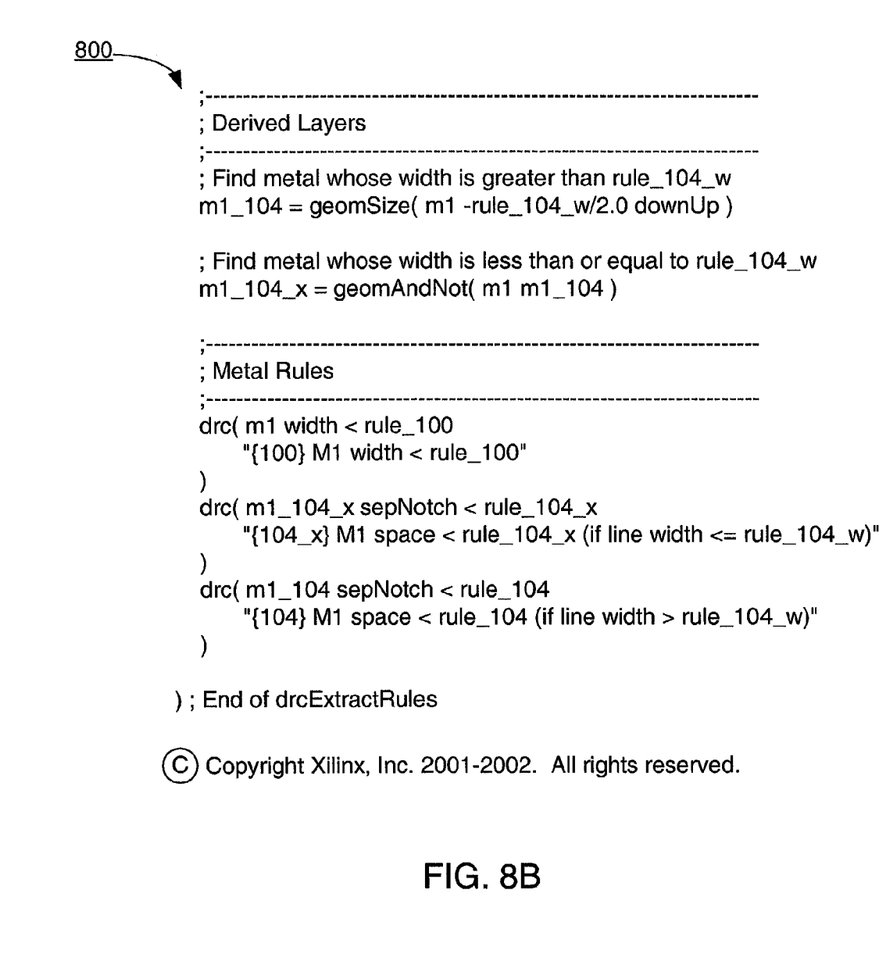

For purposes of clarity, an exemplary embodiment of a PDRC file 800 is shown in FIGS. 8A and 8B. In PDRC file 800, design rules have a design rule indicator or prefix "rule_". Notably, this was an example of a design rule indicator substitute in the description of FIG. 3 at step 304.

Referring again to FIG. 7, at step 703, design rule values in Table file 202 are used to replace design rule names in PDRC file 203 found to have a match. In other words, each design rule name in Table file 202 found in PDRC file 203 is replaced with its design rule value, where such design rule value is obtained from Table file 202. Once all such replacements are made, DRC file 204 is produced.

Figure 9A:
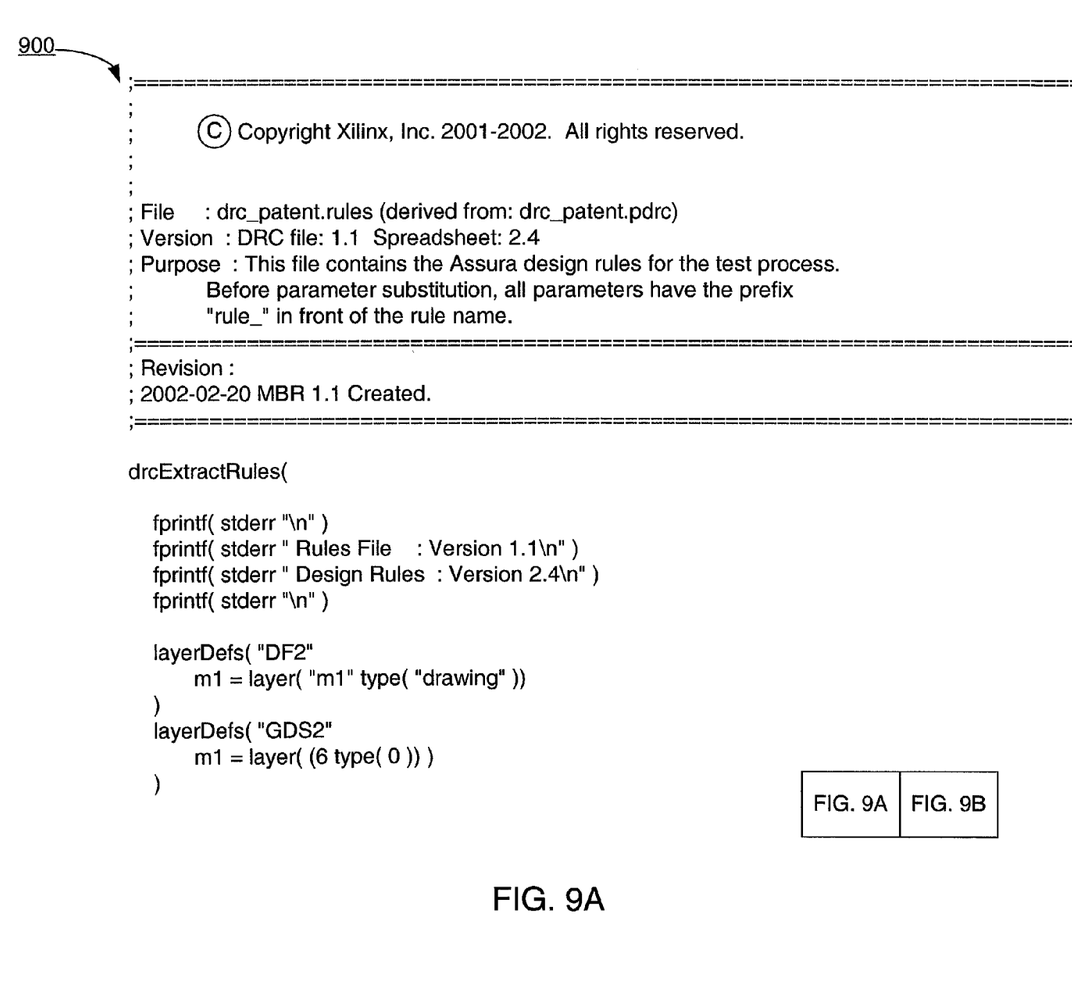
FIGS. 9A and 9B are text of an exemplary embodiment of a DRC file that may be created from the Table file of FIG. 6 and the PDRC file of FIGS. 8A and 8B in accordance with one or more aspects of the present invention.
Figure 9B:
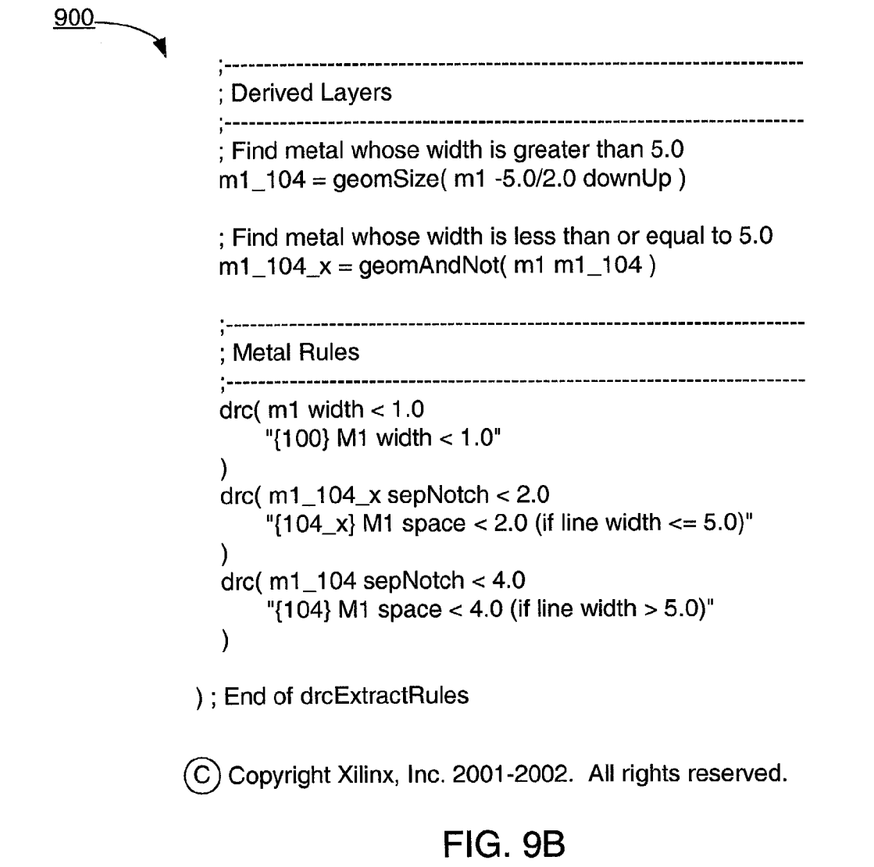

For purposes of clarity, an exemplary embodiment of a DRC file 900 that may be created from Table file 600 of FIG. 6 and PDRC file 800 of FIGS. 8A and 8B is shown in FIGS. 9A and 9B. Rules beginning with "rule_" in PDRC file 800 of FIGS. 8A and 8B have been substitute with their design rule name associated design rule value from Table file 600 in FIG. 6 to provided DRC file 900 of FIGS. 9A and 9B.

As mentioned above with respect to FIG. 3, a user selecting a column at step 305 may be a programmed computer. For example, a computer may be programmed to select a column for one iteration of parameterized DRC file process 200 of FIG. 2, and then automatically do another iteration of parameterized DRC file process 200 selecting another column. Accordingly, parameterized DRC file process 200 may be repeated until all columns or some desired portion of columns are selected. Moreover, multiple Design Rule documents 201 may be used with a single PDRC file 203. An ability to use different design rules facilitates using a same PDRC file 203 for multiple projects.

Figure 10:
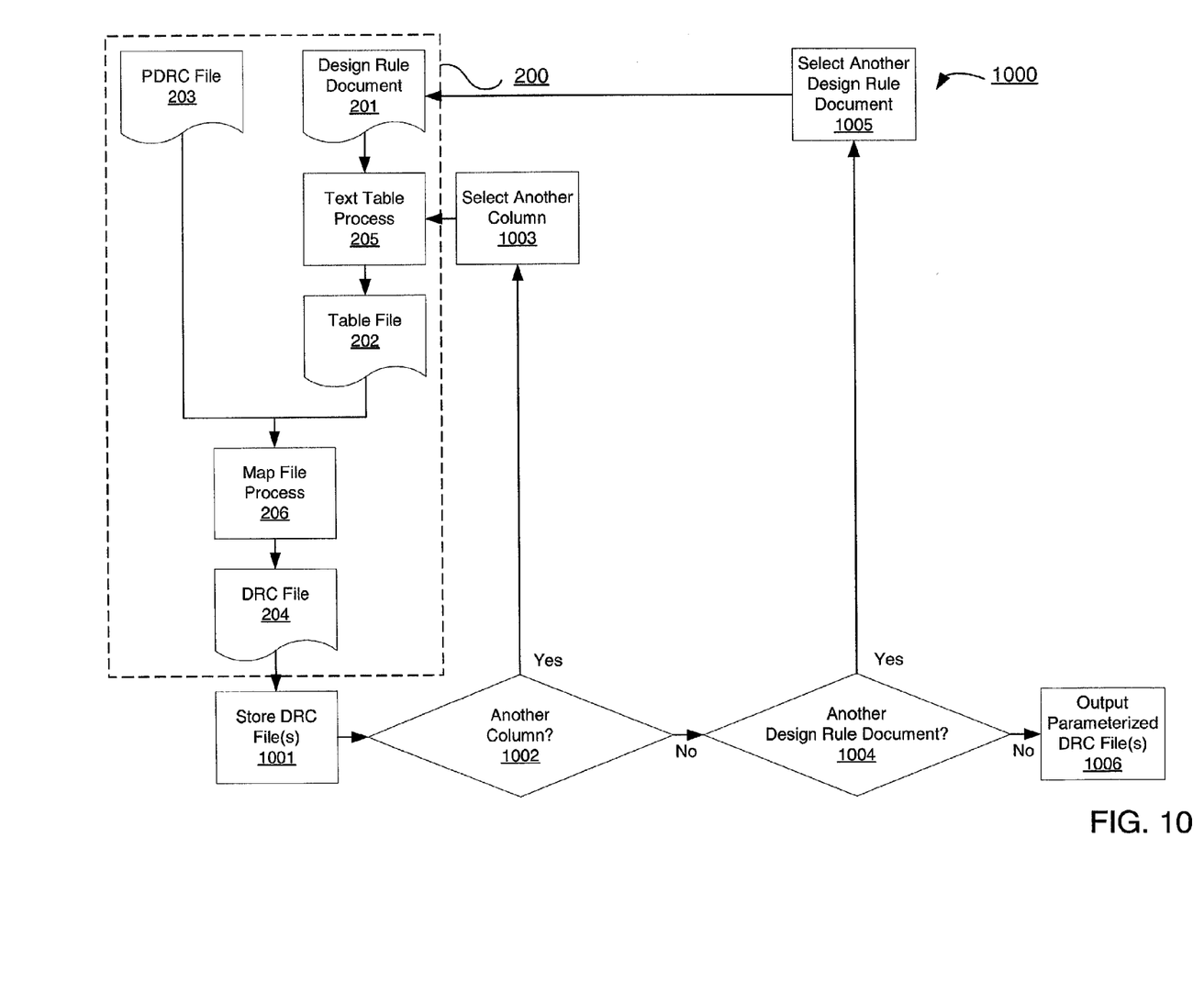
FIG. 10 is a flow chart of an exemplary embodiment of a DRC file generation process in accordance with one or more aspects of the present invention.

Referring to FIG. 10, there is shown a flow chart of an exemplary embodiment of a DRC file generation process 1000 in accordance with one or more aspects of the present invention. DRC file generation process 1000 uses parameterized DRC file process 200. At step 1001, a DRC file 204 is stored. At step 1002, an inquiry is made as to whether another column is to be selected. If another column is to be selected at step 1002, then at step 1003 a column select command is provided to Text Table process 205 at step 305 to select a another column. Parameterized DRC file process 200 then generates another DRC file 204 for such other column selected. If, however, at step 1002 no next column is to be selected, then at step 1004 an inquiry is made as to whether there is another design rule document 201. If there is another Design Rule document 201 to be selected, then at step 1005 a command to select a another design rule document is provided to parameterized DRC file process 200 to get a another Design Rule document 201 to provide to Text Table process 205. Accordingly, parameterized DRC file process 200 produces another DRC file 204 using such other Design Rule document 201. If, however, at step 1004 no other Design Rule document 201 is to be used, then at step 1006 stored DRC files 204 are provided as output. Such DRC files 204 may be provided to a DRC tool, such as Assura from Cadence of San Jose, Calif.

Some embodiments of the invention are program products containing machine-readable programs. The program(s) of the program product defines functions of the embodiments and can be contained on a variety of signal/bearing media, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

Figure 11:
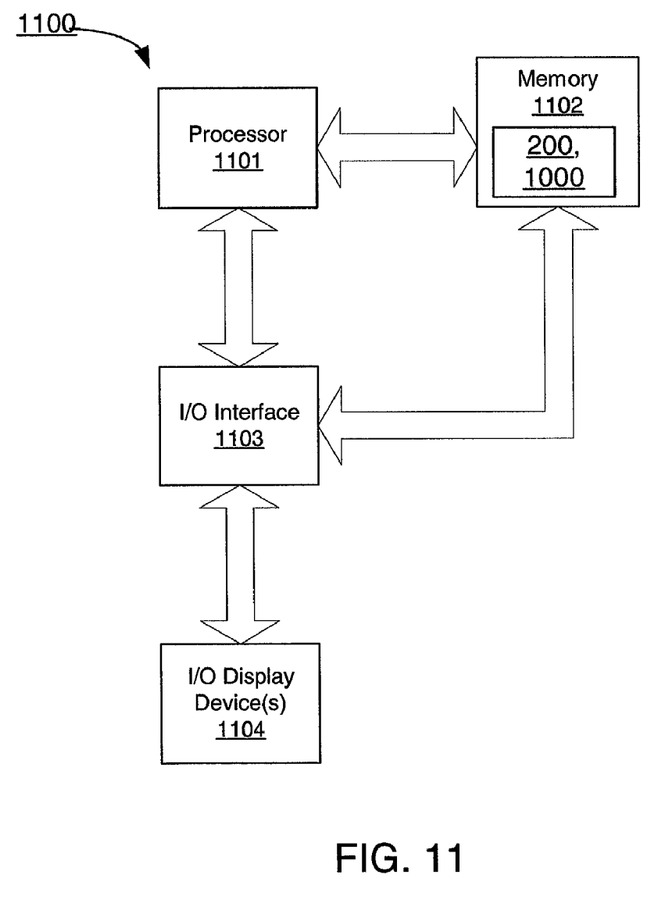
FIG. 11 is a block diagram of an exemplary embodiment of a programmed computer system in accordance with one or more aspects of the present invention.

Referring to FIG. 11, there is shown a block diagram of an exemplary embodiment of a programmed computer system 1100 in accordance with one or more aspects of the present invention. Computer system 1100 comprises processor 1101, memory 1102, one or more input/output (I/O) interface(s) 1103 and one or more I/O display device(s) 1104 in communication with one another. Memory 1102 may comprise volatile and/or non-volatile memory, including but not limited to magnetically readable memory (e.g., floppy disk, hard disk, and the like), optically readable memory (e.g., CD, DVD, and the like), and electrically readable memory (e.g., DRAM, SRAM, EEPROM, registers, latches, and the like). Though memory 1102 is illustratively shown as a single block, it should be understood that memory 1102 may comprise a plurality of elements existing at one or more levels of access with respect to processor 1101.

Some embodiments of the present invention are program products that may reside in whole or in part in memory 1102. By way of example and not limitation, memory 1102 may comprise DRAM sufficient to hold at least a program representative of process 200 or 1000, including, but not limited to, data structures in accordance with one or more design rule documents 201, PDRC files 203, and derivatives thereof as set forth herein.

Accordingly, it should be appreciated that because design rule number in a table file are separated from logic operations in a PDRC file, generation of several DRC files is facilitated by having only to effectively specify different table files. This not only facilitates maintenance of multiple DRC files for a project integrated circuit, but also facilitates migration to other projects, namely, because a new set of values in a design rule document may be used with an existing PDRC file to provide a DRC file for a new process.

Moreover, it should be appreciated that PDRC file maintenance is facilitated, as design rule values may be used in multiple locations in a PDRC file. In other words, this may be used to avoid manual hard coding mistakes made when typing numbers into multiple locations in a PDRC file. Moreover, with a PDRC file, when design rule numbers change, instead of documenting such a change only in a design rule document, such updating follows into a DRC file.

Advantageously, searching for a document is enhanced, as a design rule name may be uniquely searched in a PDRC file to indicate how many times that particular rule is used. This is not necessarily the case for a design rule value, which may not be unique to a particular design rule.

Furthermore, procedurally, maintenance is enhanced. Maintenance of design rule values by a technology development group, such as research and development, and fabrication engineering, is separated from design rules that are maintained in a PDRC file, such as by a integrated circuit computer aided design group. Moreover, design rule values are declared but once in a design rule document used by layout designers as the reference for constructing a layout.

Note that the uses of DRC, LVS, or extraction technology document file are merely examples of a file containing design rule information. The present invention can be used with any file containing design rule information for use with an electronic design automation (EDA) tool, including a variety of technology files, such as LPE (Layout Parameter Extraction) rule files, parameterized layout files and simulation model files.

While foregoing is directed to the preferred embodiment of the present invention, other and further embodiments of the invention may be devised without departing from the basic scope thereof, and the scope thereof is determined by the claims that follow. For example, though embodiments of the present invention were described in terms of a design rule document and DRC and PDRC files, other document and file types may be used in accordance with one or more aspects of the present invention, such other types include, but are not limited to, LVS and extraction technology, among other known types of rules-based technologies.

All trademarks are the respective property of their owners.

The invention claimed is:

1. A method for generating a rule-based file for producing integrated circuit, comprising:
    obtaining a rule document associating design rules and design rule values;
    generating a table file from the rule document associating design rule names for the design rules with corresponding ones of the design rule values, wherein the step of generating a table file comprises: converting the first design rule document into a text file; checking for a rule indicator in the text file; and replacing information adjacent to the rule indicator with a design rule value for a design rule found with the rule indicator;
    obtaining a parameterized rule file having logical operations associated with the design rule names; and
    replacing the design rule names in the parameterized rule file with corresponding ones of the design rule values in the table file.

2. The method of claim 1 wherein the parameterized rule file is selected from a design rule document, a layout versus schematic document, an extraction technology document, and a technology file.

3. The method of claim 1 wherein the rule document is the first design rule document, and wherein the parameterized rule file is a parameterized design rule check file.

4. The method of claim 1 wherein the step of replacing the design rule names comprises:
    comparing the design rule names in the parameterized design rule check file with corresponding design rule names in the table file to obtain the design rule values; and
    generating a design rule check file having the logical operations associated with the design rule values.

5. The method of claim 4 wherein the step of replacing information comprises selecting the information from a first type of information.

6. The method of claim 5 further comprising:
    storing the design rule check file;
    checking for a second type of information; and
    repeating the step of replacing the design rule names using the second type of information to provide another design rule check file.

7. The method of claim 5 further comprising:
    checking for a second design rule document;
    repeating the step of generating a table file using the second design rule document to provide another design rule check file.

8. The method of claim 7 wherein the second design rule document is for scaling to accommodate lithography.

9. A signal-bearing medium containing a program for producing integrated circuit which, when executed by a processor causes execution of a method comprising:
    obtaining a first rule document associating design rules and design rule value;
    generating a table file from the first rule document associating design rule names for the design rules with corresponding ones of the design rule values, wherein the step of generating a table file comprises: converting the first design rule document into a text file; checking for a rule indicator in the text file; and replacing information adjacent to the rule indicator with a rule value;
    obtaining a parameterized rule file having logical operations associated with the design rule names; and
    replacing the design rule names in the parameterized rule file with corresponding ones of the design rule values in the table file.

10. The method of claim 9 wherein the step of replacing the design rule names comprises:
    comparing the design rule names in the parameterized rule file with corresponding design rule names in the table file to obtain the design rule values; and
    generating a design rule check file having the logical operations associated with the design rule values.

11. The method of claim 10 wherein the step of replacing information comprises selecting the information from a first type of information.

12. The method of claim 11 further comprising:
    storing the first rule file;
    checking for a second type of information; and
    repeating the step of replacing the design rule names using the second type of information to provide a second rule file.

13. The method of claim 12 wherein the first rule document is a spreadsheet.

14. The method of claim 13 wherein the first type of information and the second type of information correspond to different columns of the rule values in the spreadsheet.

15. The method of claim 11 further comprising:
checking for a second rule document;
repeating the step of generating a table file using the second rule document to provide a second rule file.

16. The method of claim 15 wherein the first rule document is a first design rule document for a first minimum dimension lithography.

17. The method of claim 16 wherein the second rule document is a second design rule document for a second minimum dimension lithography different from the first minimum dimension lithography.

18. The method of claim 17 wherein the first minimum dimension lithography is for an embedded core, and the second minimum dimension lithography is for a host integrated circuit device comprising the embedded core.

19. Apparatus for generating a rule-based file for producing intergrated circuit, comprising:
means for obtaining a rule document associating design rules and design rule values;
means for generating a table file from the rule document associating design rule names for the design rules with corresponding ones of the design rule values, wherein the mean for generating a table file comprises: means for converting the first design rule document into a text file; means for checking for a rule indicator in the text file; and means for replacing information adjacent to the rule indicator with a design rule value for a design rule found with the rule indicator;
means for obtaining a parameterized rule file having logical operations associated with design rule names; and
means for replacing the design rule names in the parameterized rule file with corresponding ones of the design rule values in the table file.

20. The apparatus of claim 19 wherein the rule document is the first design rule document and the parameterized rule file is a parameterized design rule check file, and wherein the means for generating a table file comprises:
means for converting the first design rule document into a text file;
means for checking for a rule indicator in the text file; and
means for replacing information adjacent to the rule indicator with a design rule value for a design rule found with the rule indicator.

21. The apparatus of claim 20 wherein the means for replacing the design rule names comprises:
means for comparing the design rule names in the parameterized design rule check file with corresponding design rule names in the table file to obtain the design rule values; and
means for generating a design rule check file having the logical operations associated with the design rule values.

22. The apparatus of claim 21 wherein the means for replacing information comprises selecting the information from a first type of information, and wherein the apparatus further comprises:
means for storing the design rule check file;
means for checking for a second type of information; and
means for repeating the replacing the design rule names using the second type of information to provide another design rule check file.

* * * * *